United States Patent
Foster et al.

(10) Patent No.: US 8,120,375 B2
(45) Date of Patent: Feb. 21, 2012

(54) METHOD FOR USING PROBE CARD

(75) Inventors: Craig Z. Foster, Los Gatos, CA (US); Ray Wakefield, Palo Alto, CA (US)

(73) Assignee: Nextest Systems Corporation, San Jose, CA (US)

( * ) Notice: Subject to any disclaimer, the term of this patent is extended or adjusted under 35 U.S.C. 154(b) by 595 days.

(21) Appl. No.: 11/506,653

(22) Filed: Aug. 17, 2006

(65) Prior Publication Data

US 2006/0279302 A1    Dec. 14, 2006

Related U.S. Application Data

(62) Division of application No. 10/902,188, filed on Jul. 28, 2004, now Pat. No. 7,098,650.

(60) Provisional application No. 60/490,621, filed on Jul. 28, 2003.

(51) Int. Cl.
*G01R 31/26* (2006.01)
*G01R 31/00* (2006.01)

(52) U.S. Cl. .............. 324/762.01; 324/756.03

(58) Field of Classification Search ........... 324/754, 324/765, 761–762, 158.1, 760, 754.01–754.03, 324/762.01–762.1, 755.01–755.09
See application file for complete search history.

(56) References Cited

U.S. PATENT DOCUMENTS

| | | | |
|---|---|---|---|
| 3,810,016 A * | 5/1974 | Chayka et al. ............ 324/762 |
| 4,038,599 A | 7/1977 | Bove et al. | |
| 4,786,867 A | 11/1988 | Yamatsu | |
| 4,950,982 A | 8/1990 | Obikane et al. | |
| 5,059,898 A * | 10/1991 | Barsotti et al. ............ 324/762 |
| 5,081,415 A * | 1/1992 | Liu et al. .................. 324/537 |
| 5,559,446 A | 9/1996 | Sano | |
| 5,818,249 A | 10/1998 | Momohara | |
| 5,982,183 A | 11/1999 | Sano | |
| 6,078,186 A * | 6/2000 | Hembree et al. ............ 324/755 |
| 6,305,230 B1 | 10/2001 | Kasukabe et al. | |
| 6,563,330 B1 | 5/2003 | Maruyama et al. | |
| 6,600,329 B2 * | 7/2003 | Lee ......................... 324/754 |
| 6,741,085 B1 | 5/2004 | Khandros et al. | |
| 6,784,678 B2 * | 8/2004 | Pietzschmann ....... 324/750.22 |
| 6,798,224 B1 | 9/2004 | Hembree et al. | |
| 6,838,893 B2 | 1/2005 | Khandros, Jr. et al. | |
| 6,984,998 B2 * | 1/2006 | Sun et al. ................. 324/754 |

OTHER PUBLICATIONS

Taiwanese Office Action issued Feb. 23, 2011 with IPO Search Report.
Taiwanese Associate's Comments on Feb. 23, 2011 Office Action.

(Continued)

*Primary Examiner* — Jermele M Hollington
*Assistant Examiner* — Tung X Nguyen
(74) *Attorney, Agent, or Firm* — Dorsey & Whitney LLP

(57) ABSTRACT

An apparatus for use with a wafer prober and a probe card comprising a stiffening member having a feature defining a first plane. The stiffening member is mountable atop the central portion of the probe card. A reference member is provided to mount to the wafer prober and has an underside with a feature defining a second plane. When the feature of the stiffening member defining the first plane is urged against the feature of the reference member defining a second plane the probe tips of the probe card are substantially planarized relative to the wafer prober.

14 Claims, 13 Drawing Sheets

OTHER PUBLICATIONS

Korean associate Mar. 8, 2011 instructional letter with suggested response enclosing Feb. 18, 2011 official Office Action from the Korean Intellectual Property Office for corresponding Korean patent application No. 10-2006-7001928, pp. 1-8.

Korean associate transmittal letter dated Apr. 27, 2011 enclosing Argument and Amendment filed in response to Official Office Action dated Feb. 18, 2011 from the Korean Intellectual Property Office for corresponding Korean patent application No. 10-2006-7001928, pp. 1-28.

* cited by examiner

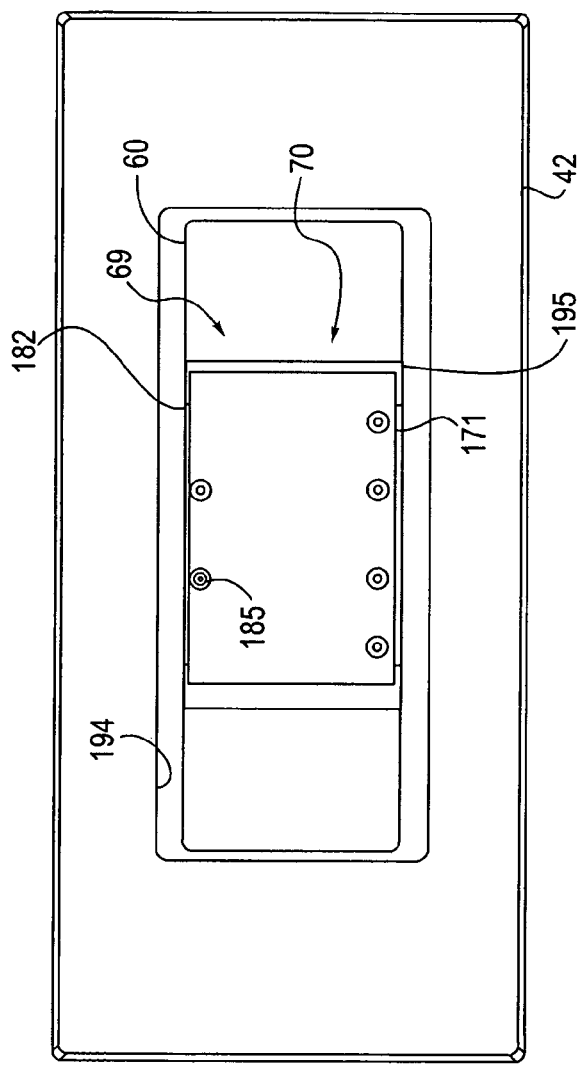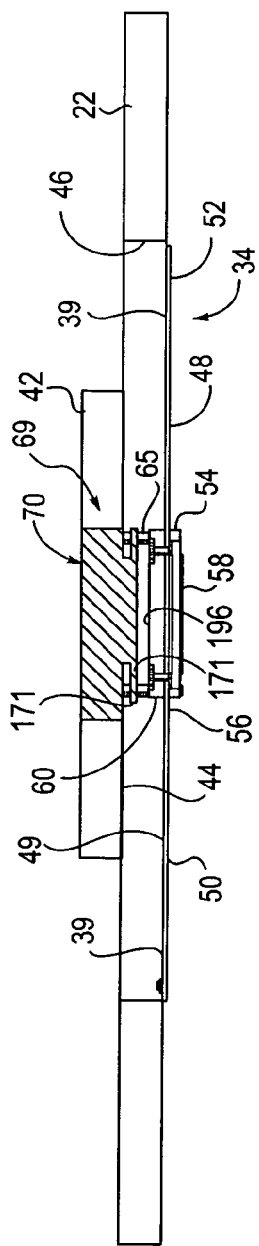

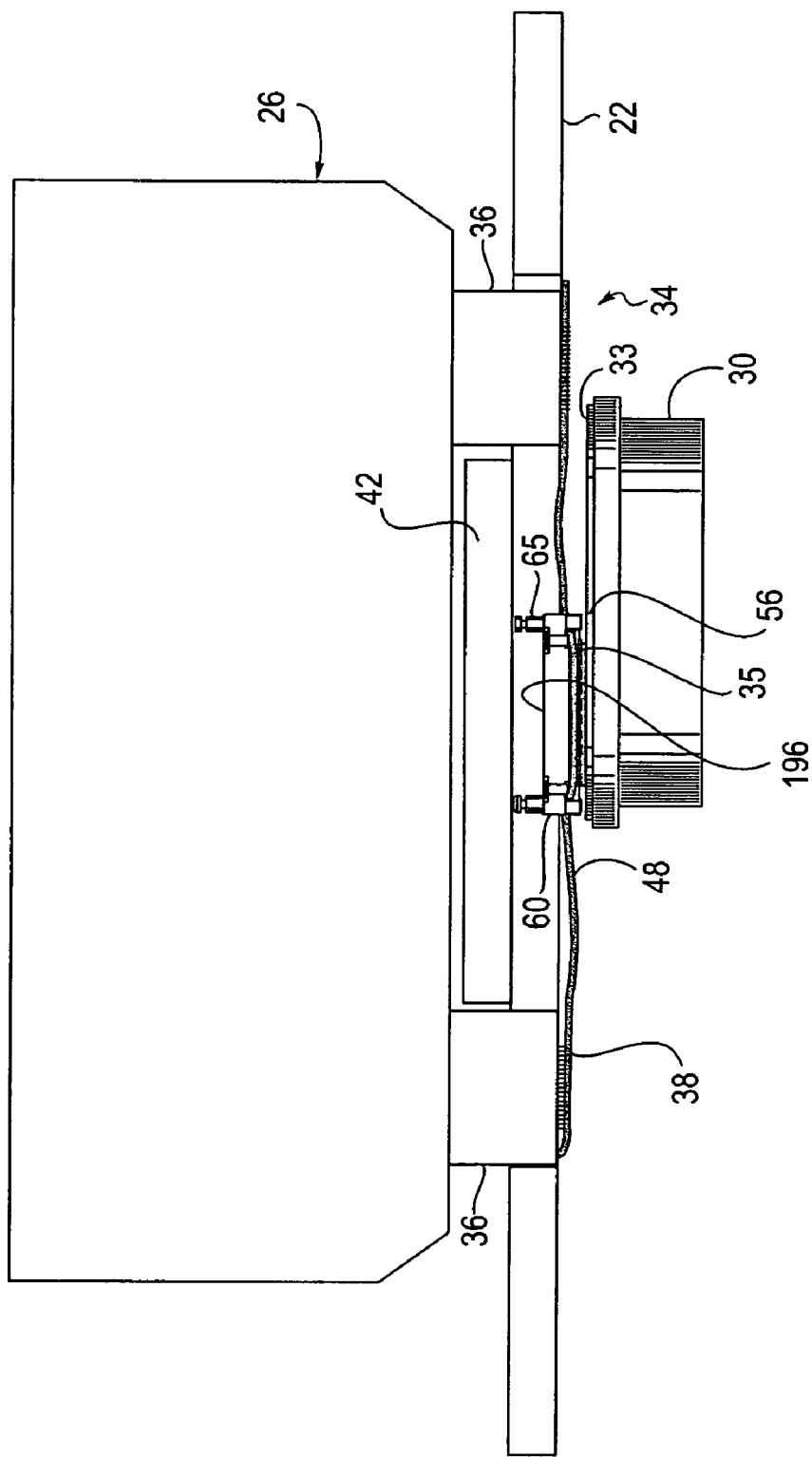

METHOD FOR USING PROBE CARD

CROSS REFERENCE TO RELATED APPLICATION

This application is a divisional application of U.S. utility patent application Ser. No. 10/902,188 filed Jul. 28, 2004 now U.S. Pat. No. 7,098,650, and claims the benefit of U.S. provisional patent application Ser. No. 60/490,621 filed Jul. 28, 2003, the entire content of which is incorporated herein by this reference.

FIELD OF THE INVENTION

The present invention relates generally to systems for testing integrated circuits in wafer form and, more particularly, to apparatus for planarizing probe cards for use therewith.

BACKGROUND OF THE INVENTION

Manufacturers in the electronics industry use automatic test systems or testers to test various electronic components, integrated circuits (ICs) and other devices under test (DUTs) to cull out defective devices. For example, data patterns are delivered to an integrated circuit with specific timing and voltage settings through timing generators and pin electronic channels to test the functionality of the integrated circuit. Data is then read from the integrated circuit to ensure that the device responds correctly. A variety of parametric timing tests may also be performed to validate correct operation of the integrated circuit as well as adherence to its specifications. Generally, it is desirable to test integrated circuits at several points during the manufacturing process, including while they are still part of a wafer or substrate.

Equipment used in wafer testing can include a wafer prober and an automated test system. A conventional wafer prober has a movable chuck which serves to transport the wafer to a position underlying a probe card mounted to the top deck of the wafer prober by being clamped at its periphery. A probe array is typically provided on the underside of the probe card for engaging the bonding pads of one or more die on the wafer. A plurality of contact elements, electrically coupled with the probe array, are usually provided at the periphery on the top of the probe card. The automated test system includes one or more testers which overlie the top deck of the wafer probe and have an electrical interface for electrically engaging the contact elements of the probe card.

Unfortunately, changes in temperature and mechanical forces experienced by the probe card during testing can result in distortion of the probe card, thus deflecting the generally unsupported central portion of the probe card where the probe array is located. The larger the probe card, the more deflection can occur in the probe card. Such distortion of the probe card can result in undesirable alignment errors between the probe array of the probe card and the chuck, thus compromising the accuracy or completeness of the testing of die carried by the chuck.

In view of the foregoing, it would be desirable to minimize distortion of the probe card, particularly in the vicinity of the probe array mounted to the underside of the probe card.

SUMMARY

An apparatus for use with a wafer prober and a probe card comprising a stiffening member having a feature defining a first plane is provided. The stiffening member is mountable atop the central portion of the probe card. A reference member is provided to mount to the wafer prober and has an underside with a feature defining a second plane. When the feature of the stiffening member defining the first plane is urged against the feature of the reference member defining a second plane the probe tips of the probe card are substantially planarized relative to the wafer prober.

DETAILED DESCRIPTION OF THE DRAWINGS

FIG. 10 is a top plan view the apparatus for planarizing a probe card of FIG. 2 positioned relative to the reference plate of the wafer prober.

FIG. 17 is a schematic, side elevational view of the apparatus for planarizing a probe card of FIG. 2 in an engaged position.

FIG. 18 is a schematic side elevational view, similar to FIG. 2, of a portion of the automatic test system and wafer prober of FIG. 1 showing the apparatus for planarizing a probe card of FIG. 2 in an engaged position.

DETAILED DESCRIPTION

Figure 1:
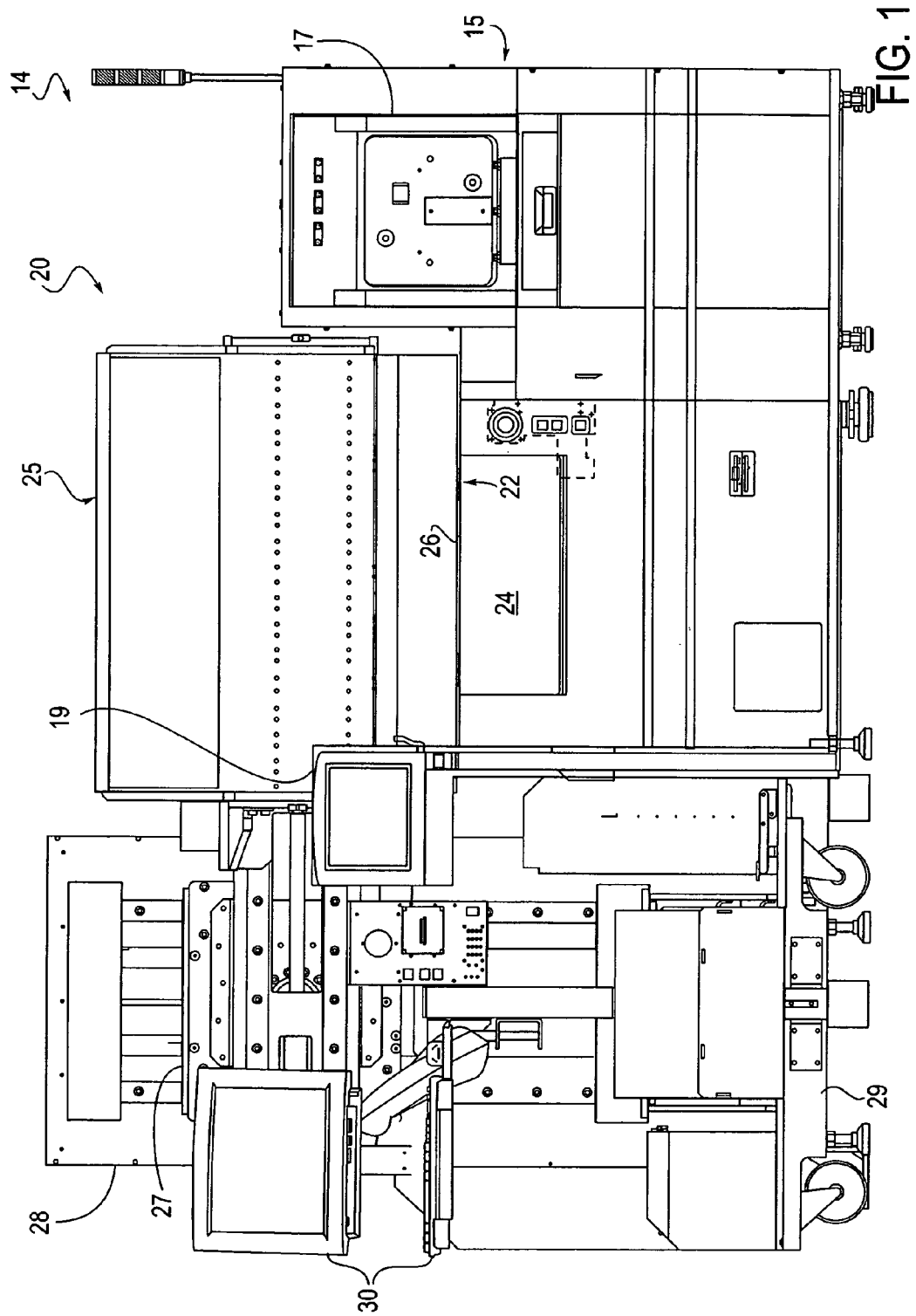
FIG. 1 is an elevational view of an automatic test system and wafer prober using the apparatus for planarizing a probe card of the present invention.

FIG. 1 illustrates the main components of a wafer testing system 14, namely a wafer prober 15 and an automated test system 20. Although any suitable wafer prober can be utilized, a suitable wafer prober is of the type manufactured as model number UF3000 by Accretech located in Tokyo, Japan. Wafer prober 15 generally includes a wafer loader 17, controls 19 and a housing 21 provided with a top deck 22 and an access door 24 (see FIG. 1).

Figure 2:
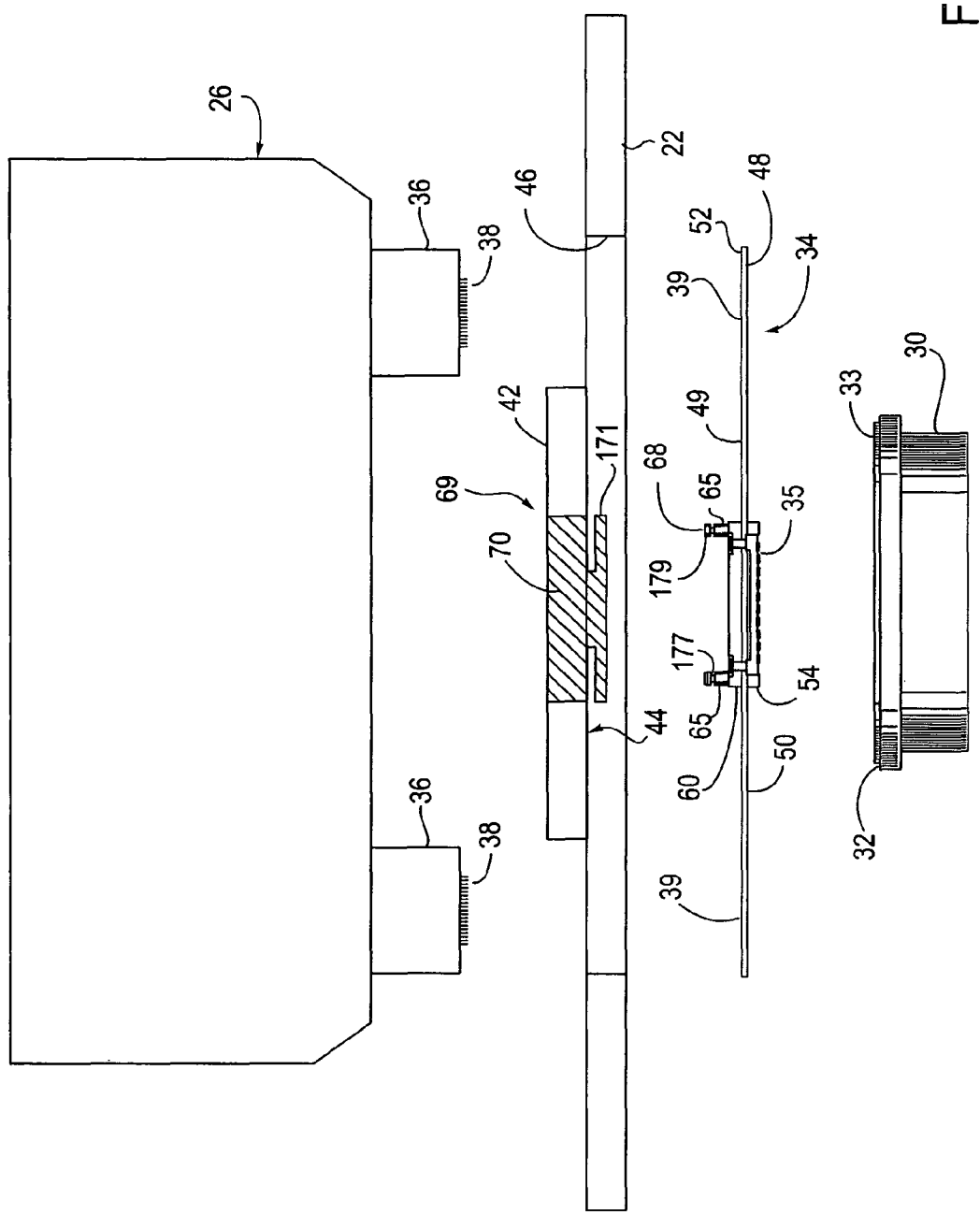
FIG. 2 is an exploded, schematic side elevational view of a portion of the automatic test system and wafer prober of FIG. 1 showing the apparatus for planarizing a probe card of the present invention.

Automated test system 20 can be of any suitable type, such as of the type disclosed in copending U.S. application Ser. No. 10/170,916 filed Jun. 12, 2002, the entire content of which is incorporated herein by this reference. The automated test system 20 includes one or more testers and as shown a single tester 25 having a test head 26. The tester 25 is supported above the wafer prober 15 by a support arm 27 that is vertically adjustable on a post 28 upstanding from a wheelable base 29. The system 20 further includes controls 30. FIG. 2 shows a schematic and enlarged view of portions of the wafer prober 15 and test system 20 and specifically the interface between the test head 26 and the wafer prober 15 for performing automated wafer testing. The wafer prober 15 includes a movable chuck 30, located behind the access door 24 of the wafer prober, having a top substantially planar surface 32 on which a wafer 33 is placed. Typically, top deck 22 of the wafer prober 15 is a reference plane to which probe manufacturers planarize chuck 30 so that the top deck 22 is therefore planar and parallel with respect to the top surface 32 of the chuck 30. A plurality of die (not shown) have been formed on the wafer 33, each have a plurality of bonding pads, contact pads or other contact interconnects formed on its top surface.

Figure 4:
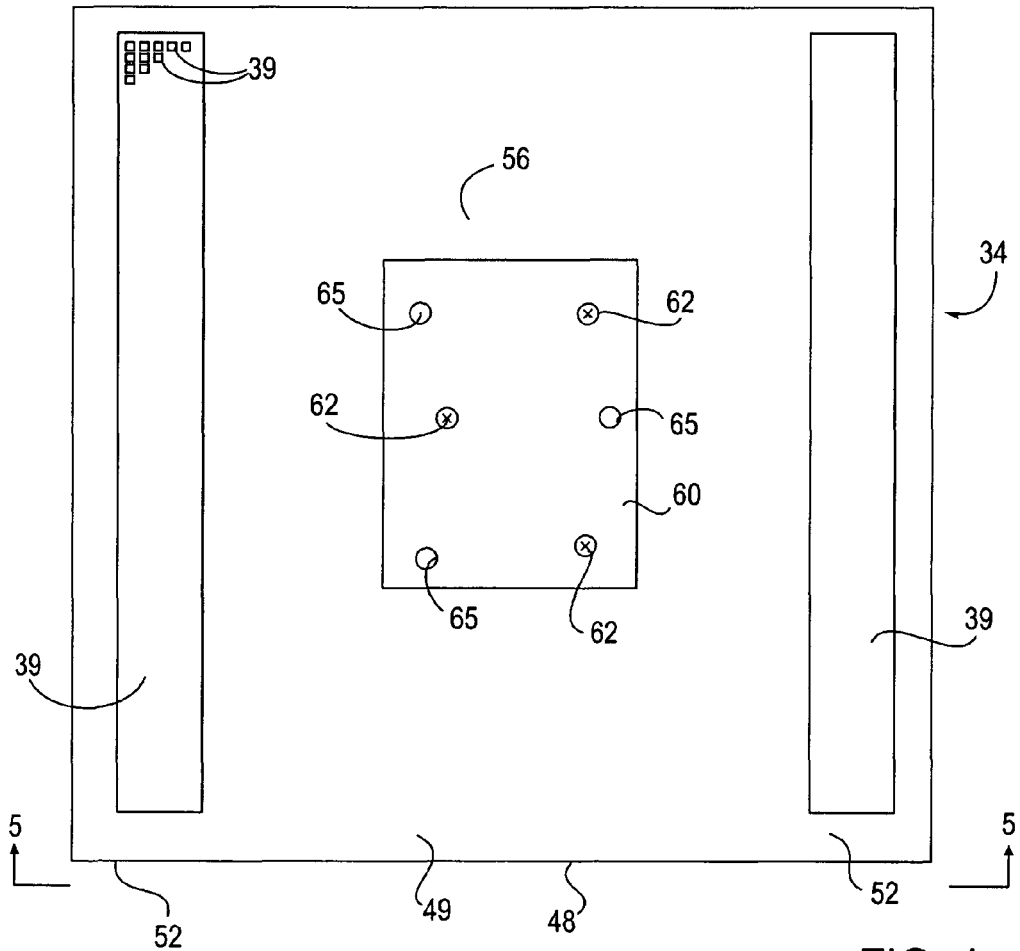
FIG. 4 is a schematic, top plan view of a probe card for use with the apparatus for planarizing a probe card of FIG. 2.

Each test head 26 includes an electrical interface 36, for example input/output blocks, for outputting test signals to the die undergoing testing and receiving response signals from the die to be analyzed by the automate test system 20 (see FIG. 2). The electrical interface 36 includes a plurality of test pins 38 for electrically connecting the test head 26 to the probe card 34 and hence to the die electrically connected to the probe card 34. The test pins 38 are arranged to contact a corresponding plurality of contact pads 39 on the probe card 34, which are illustrated in FIG. 4.

Figure 3:
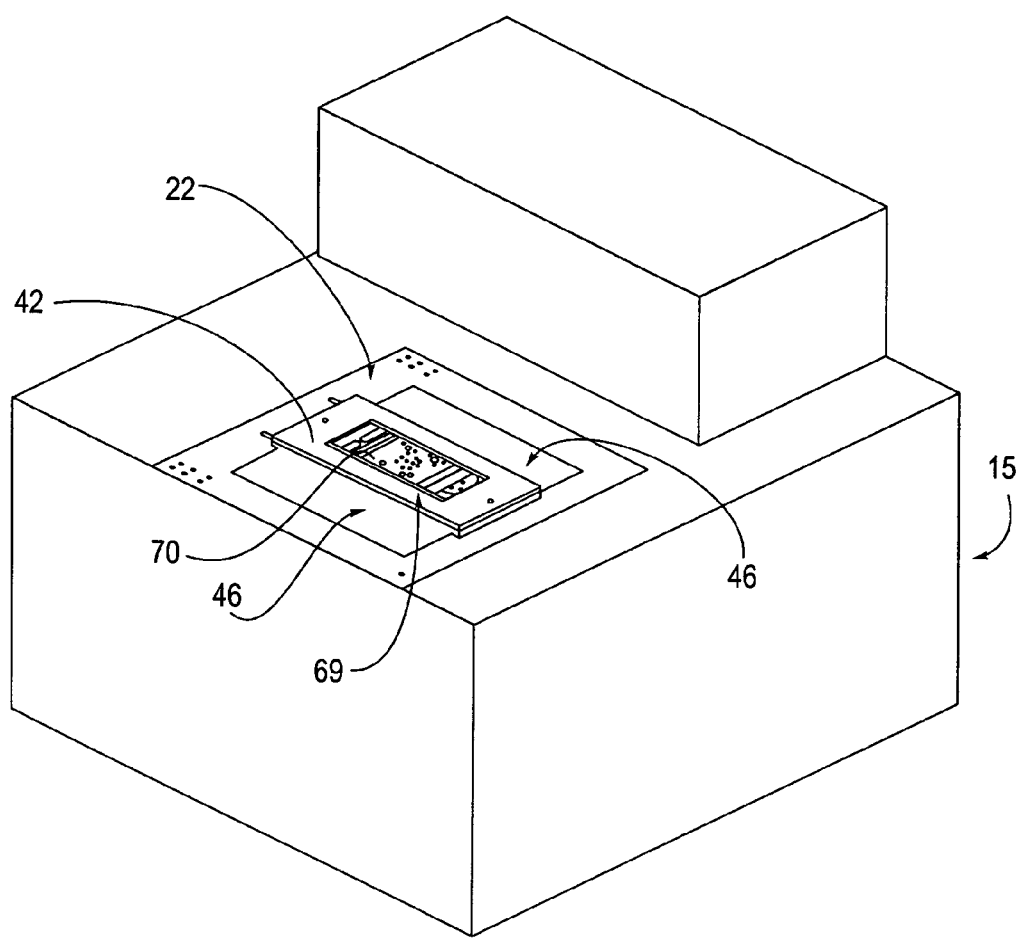
FIG. 3 is a schematic, perspective view of the wafer prober of FIG. 1 having a top deck with a reference plate thereon.

The system of the invention further includes a reference member or plate 42 mounted to or integral with the top deck plate 22 of the prober 15 (see FIGS. 2 and 3). The reference plate 42, more clearly illustrated in FIG. 3 which shows a perspective top view of the wafer prober 15 without the test head 26, is supported above the probe card 34 by the top deck 22. Reference plate 42 preferably bridges over the central opening in top deck 22, as shown in FIG. 3, and is more preferably centered over the top deck. The reference or support member 42, which can be a thick, highly planar plate made from any suitable material such as metal or ceramic. Reference member 42 preferably has a feature defining a plane, which is preferably on the underside of the reference member 42. Such feature is planar with the top deck 22, and hence parallel to and planar with respect to the top surface 32 of the chuck 30, and is preferably a planar bottom surface 44. To achieve a high degree of planarity for reference surface 44, the reference plate 42 is preferably made from a rigid material, for example a metal such as steel or aluminum. Access openings 46 are provided between the reference plate 42 and the top deck 22 to permit the electrical interface 36 of the test head 26 to access the underlying probe card 34.

A probe card 34 is carried by the wafer prober and provides an electrical interface between the one or more test heads 26 of the test system 20 and a die of the wafer 33 undergoing testing (see FIG. 2). Probe card 34 includes a substrate layer which can be made from any suitable dielectric material and is preferably a printed circuit board (PCB) 48 having a first or top surface 49 and an opposite second or bottom surface 50 (see FIGS. 4 and 5). A plurality of contact pads 39 are formed on the top surface 49 of the PCB 48 and are preferably located in a peripheral portion 52 of the probe card 34. The contact pads 39, some of which are shown in FIG. 4, are arranged in one or more patterns and accessible from the top of the probe card 34. The plurality of test pins 38 of the test head 26 are arranged in a corresponding one or more patterns as the pattern of contact pads 39 to permit contact and registration of the test pins 38 with the contact pads 39. Contact pads 39, including pluralities of distinct arrays thereof, can extend partially or completely around the peripheral portion 52 of the probe card 34. Accordingly, it is appreciated that the invention is broad enough to cover cards 34 having contact pads 39 disposed only at portions of the periphery 52, such as along two sides as shown in FIG. 4. The probe card 34 can further include a substrate member, for example block 54 made from ceramic or any other suitable material, secured or rigidly coupled to the bottom surface 50 of the PCB 48 and located within a central portion 56 of the probe card 34. The central portion 56 of the card 34 is preferably that portion of the card 34 interior of contact pads 39 and more preferably that portion of the card 34 beneath the central portion of the reference plate 42.

Figure 5:
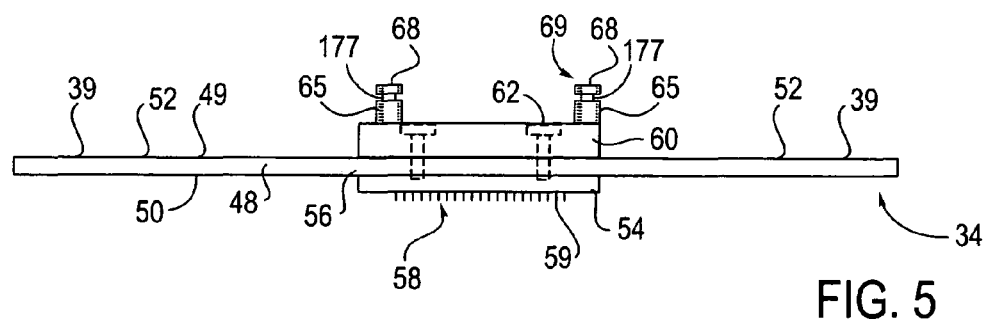
FIG. 5 is a schematic, side elevational view taken along the line 5-5 of FIG. 4, of the probe card of FIG. 4.

A probe array or assembly 58 descends or depends from the centrally-disposed block 54, which supports the probe array 58 (see FIG. 5). The probe elements or probes 59 of the probe array 58 are arranged in a pattern corresponding to the pattern of contact bonding pads or balls of the die undergoing testing. Each of the probes 59 has a probe end or tip which registers with and engages a contact pad of the die when the probe array 58 engages the wafer 33. The probe tips of the probe array 58 are aligned in a plane, sometimes referred to herein as the plane of the probe array 58. Electrical leads are provided in the probe card 34, for example conductive traces (not shown) within the PCB 48, for electrically coupling the contact pads 39 on the top surface 49 of the PCB 48 to the probes 59 of the probe array 58 descending from the central portion 56 of the underside of PCB 48.

The probe card 34 preferably further includes a stiffening member or plate 60 attached to the top surface 49 of the PCB 48 within the central portion 56 of the probe card 34 (see FIGS. 4 and 5). The stiffener plate 60 is preferably made from any suitable rigid material such as metal and may be attached to the PCB 48 by screws (not shown). The stiffener plate 60 adds rigidity to the central portion 56 of the probe card 34. The probe card 34 further includes three or more planarizing adjustment screws 62 for adjusting the plane of the probe array 58, and specifically the plane formed by the tips of the probes 59, with respect to the plane of the stiffener plate 60. More specifically, screws 62 permit the plane of the probe array 58 to be made substantially parallel to the plane of the stiffener plate 60.

The central portion of probe card 34, and preferably stiffener plate 60, includes a feature defining a plane. Such feature is preferably a plurality of at least three alignment elements 65 are attached to the stiffener plate 60 within the central portion 56 of the probe card 34 and extend outwardly, and preferably upwardly, from the probe card 34 (see FIGS. 4 and 5). The alignment elements 65 have top surfaces 68 and are arranged on the stiffener plate 60 such that the top surfaces 68 substantially define a plane. As shown in FIG. 4, the alignment elements 65 are spaced apart so as to form the shape of a triangle, preferably an equilateral triangle, when viewed in plan. The alignment elements 65 are preferably made out of metal that can be machined with a high degree of accuracy. The plane formed by the top surfaces 68 of the alignment elements, that is the feature of the probe card defining a plane, is preferably substantially parallel to the plane of the plane of the probe array 58 and preferably the plane of the stiffener plate 60.

A means or cooperating mechanism is included for urging the feature of the probe card 34 defining a plane against the reference member 42 and preferably the feature of the reference member 42 defining a plane. In the illustrated embodiment, such means or apparatus 69 includes alignment elements 65 and serves to make the plane formed by the tips of probes 59 planar or parallel with the bottom surface 44 of reference plate 42. Apparatus 69 can part of a cooperating mechanism of the invention that is carried by the reference member 42 and the central portion of the probe card 34 for rigidly coupling the central portion of the probe card 34 to the reference member 42. Such cooperating mechanism and apparatus 69 preferably include a latching mechanism 70 mounted to the reference plate 42 for latching the alignment elements 65 of the probe card 34 to the reference plate 42. Preferably, the latching mechanism 70 lifts and urges the top surface 68 of the alignment elements 65 against the bottom, planar surface 44 of the reference plate 42. Latching mechanism 70 is rigidly coupled to wafer prober 15, and preferably to top deck 22 thereof. In one preferred embodiment, illustrated herein, the latching mechanism is bolted or otherwise rigidly secured to reference plate 42.

Figure 7:
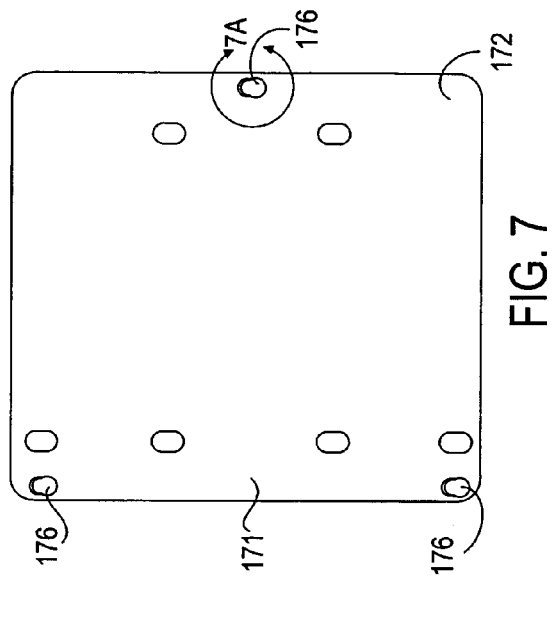
FIG. 7 is a top plan view of the latching plate of FIG. 6.
Figure 7A:
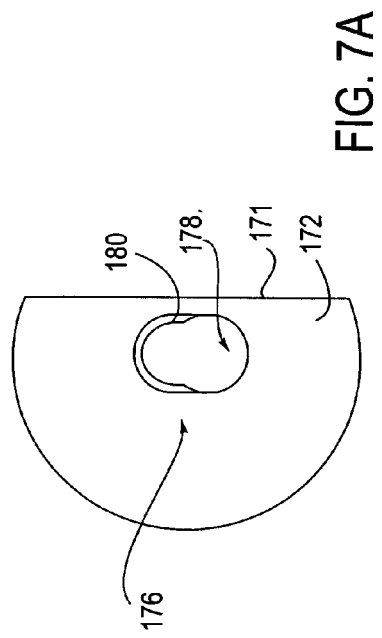
FIG. 7A is an enlarged view of a portion of the latching plate of FIG. 6 indicated by the circle 7A of FIG. 7.
Figure 6:
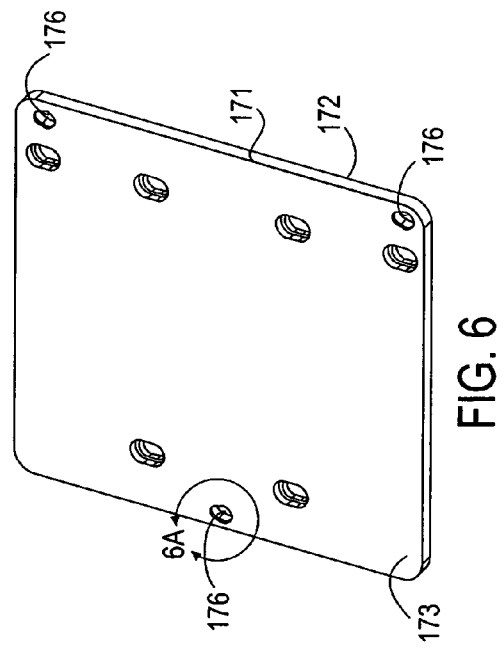
FIG. 6 is a perspective view of a latching plate of the apparatus for planarizing a probe card of FIG. 2.
Figure 6A:
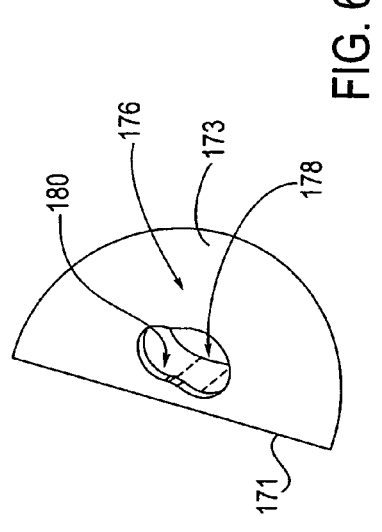
FIG. 6A is an enlarged view of a portion of the latching plate of FIG. 6 indicated by the circle 6A of FIG. 6.

Gripping or latching mechanism 70 according to one embodiment of the invention includes a latch member or plate 171 having a first or top surface 172 and an opposite second or bottom surface 173 (see FIGS. 6 and 7). A plurality of holes or slots 176 adapted to engage or receive at least a portion of respective alignment elements 65 extend through surfaces 172 and 173 of the latching plate. The alignment elements or latch pins 65 are preferably in the form of mushroom latch pins with indentations such as annular groves 177 extending around the cylindrical body of the alignment element for facilitating latching of the element 65 by the plate 171 (see FIGS. 2 and 9). Each keyhole slot 176 includes an enlarged opening 178 large enough for the head 179 of an alignment element 65 to pass therethrough and an inner ledge 180 that slides into the groove 177 of the alignment element 65 to engage the alignment element 65 beneath the head 179 of the element 65.

Figure 8:
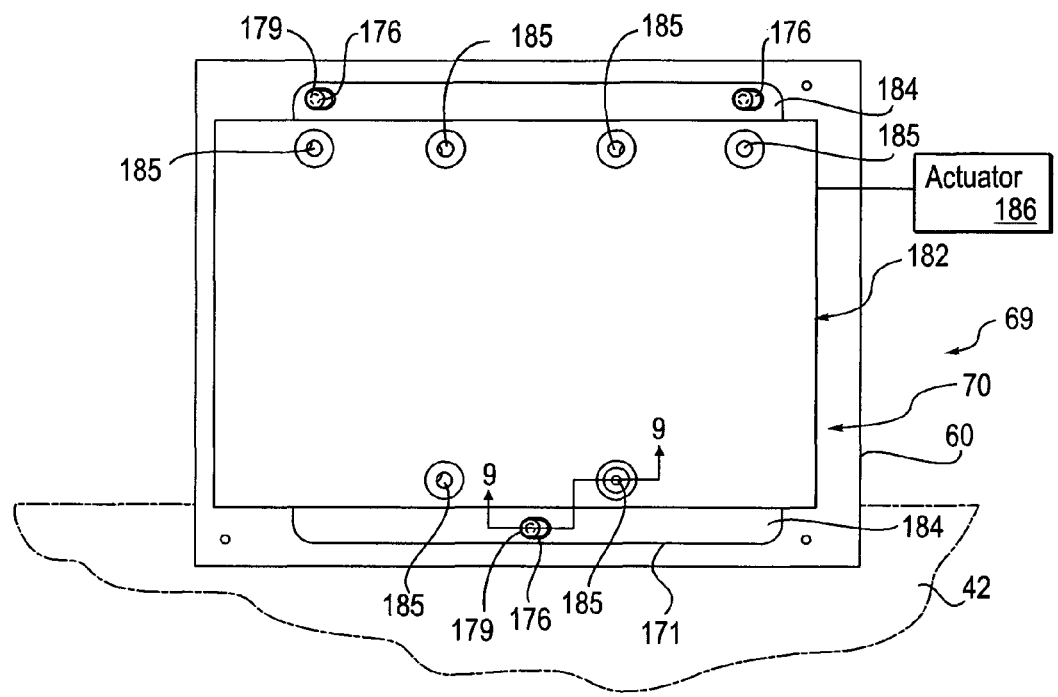
FIG. 8 is a top plan view of the apparatus for planarizing a probe card of FIG. 2 in a first position.
Figure 9:
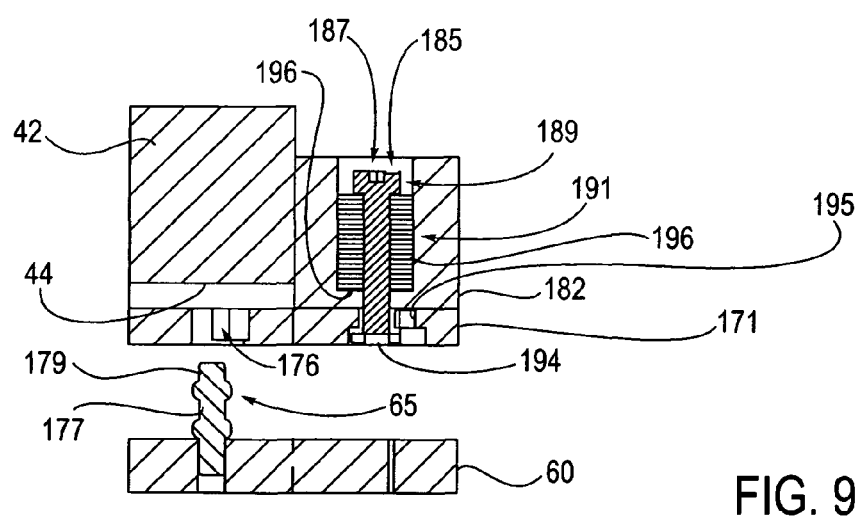
FIG. 9 is a cross-sectional view of the apparatus for planarizing a probe card of FIG. 2 taken along the line 9-9 of FIG. 8.

The gripping or latching assembly or mechanism 170 further includes a lift plate 182 positioned above the latch plate 171, as shown in FIGS. 8 and 9. Side portions 184 of the latch plate 171 extend beyond the lift plate 171, as shown in FIG. 8, and underneath the reference plate 42 of the wafer prober 15, shown in phantom lines in FIG. 8 and solid line in FIG. 9. The keyhole slots 76 are located within the side portions 184 of the latch plate 171 and are therefore not covered by the overlying lift plate 182. The lift plate 182 is mechanically coupled to the underlying latch plate 171 by six mechanical couplers or fasteners 185. The latching mechanism 70 includes an actuator or mechanism 186, shown schematically in FIG. 8, that is mechanically coupled to the lift plate 182 for moving the lift plate 182 and the latch plate 171 mechanically coupled to the lift plate 182 laterally and upwardly. The actuator may be of any suitable type, such as pneumatic, hydraulic, electric, mechanical or any combination of the foregoing.

Each mechanical coupler 185, one of which is illustrated in some detail in FIG. 9, is preferably from an I-shaped body or pin 187 extending through the lift plate 182. The pin 187 has a flanged top end 189 seated against a spring 191 and a flanged bottom end 194 seated in a key shaped slot 195, similar to slot 176, formed in the latch plate 171. The spring 191 is preferably a suitable stack of bellevelle washers extending concentrically around the pin 187 and seated or disposed within a cavity or bore 196 formed in the lift plate 182. The spring 191 biases the pin 187 by having a first or top end rest or push against the top end 189 of the pin 187 and the second or bottom end rest or push against an inner surface of a flange 196 forming the bottom of cavity 192.

FIG. 10 shows a top view of the latching mechanism 70 relative to the reference plate 42 of the wafer prober 15. The lift plate 182 is positioned within an opening 194 of the reference plate 142. The side portions 184 of the latch plate 171 are positioned beneath the reference plate 42, and therefore not visible in FIG. 10, so as to position the keyhole slots 176 located within the side portions 184 beneath the lower planar surface 44 of the reference plate 42. FIG. 9 shows one of the keyhole slots 176 beneath the lower planar surface 44 of the reference plate 42.

Figure 11:
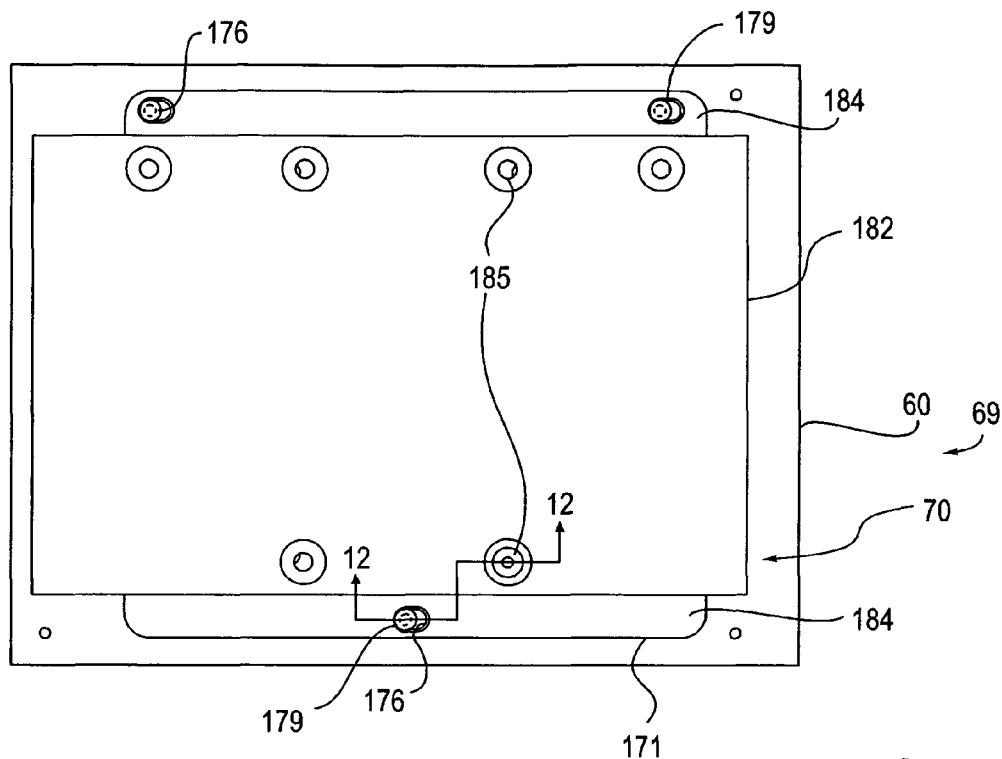
FIG. 11 is a top plan view, similar to FIG. 8, of the apparatus for planarizing a probe card of FIG. 2 in a second position.
Figure 12:
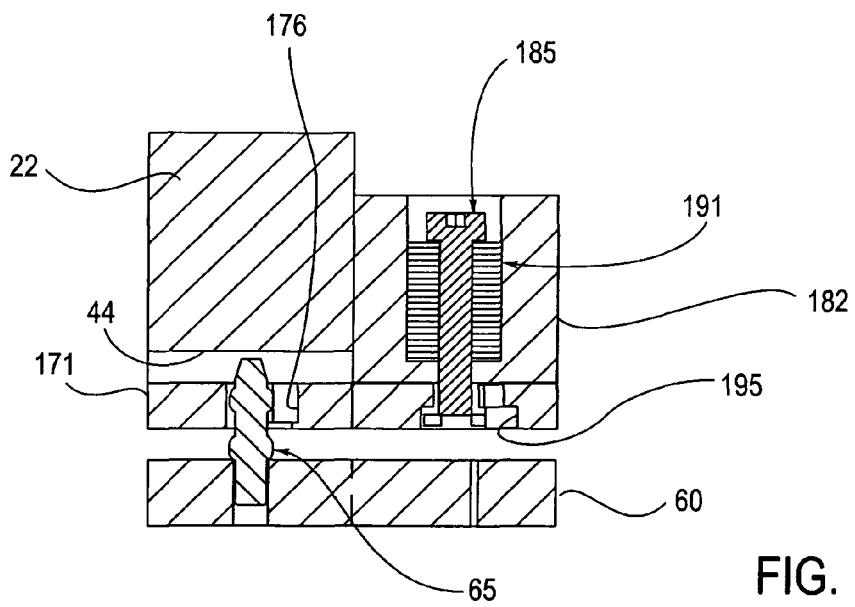
FIG. 12 is a cross-sectional view, similar to FIG. 9, of the apparatus for planarizing a probe card of FIG. 2 taken along the line 12-12 of FIG. 11.
Figure 13:
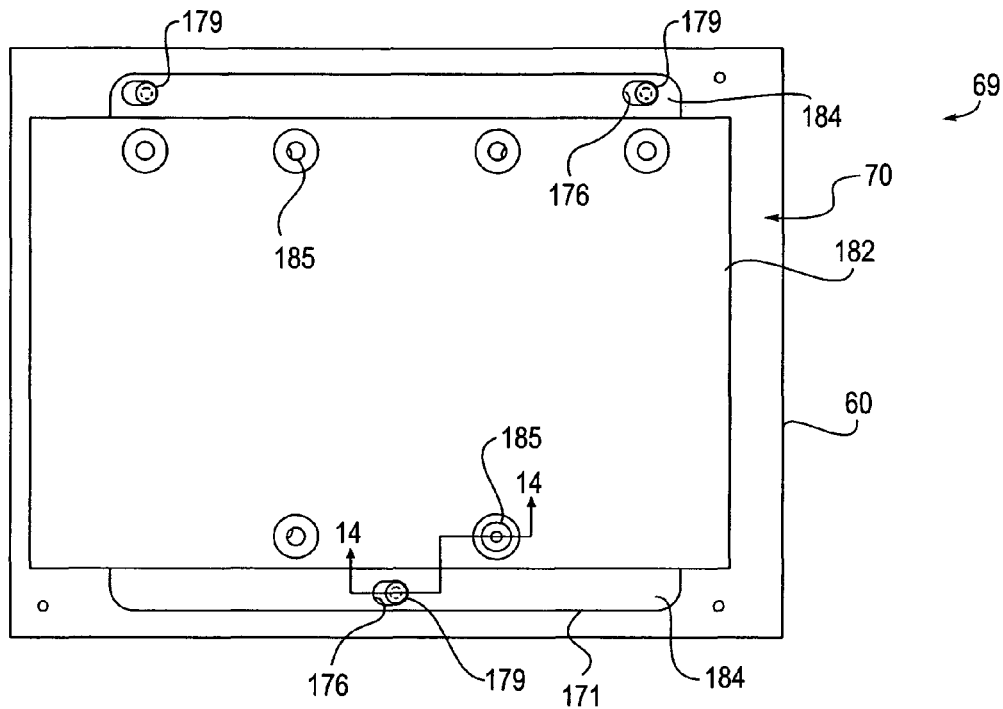
FIG. 13 is a top plan view, similar to FIG. 8, of the apparatus for planarizing a probe card of FIG. 2 in a third position.
Figure 14:
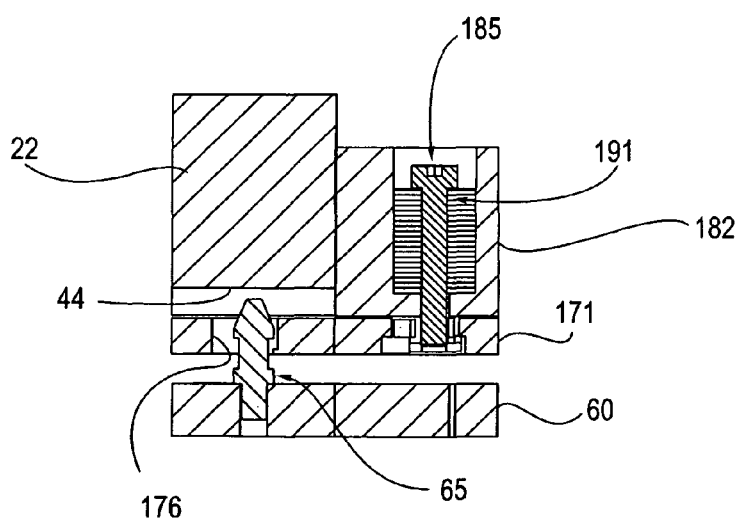
FIG. 14 is a cross-sectional view, similar to FIG. 9, of the apparatus for planarizing a probe card of FIG. 2 taken along the line 14-14 of FIG. 13.
Figure 15:
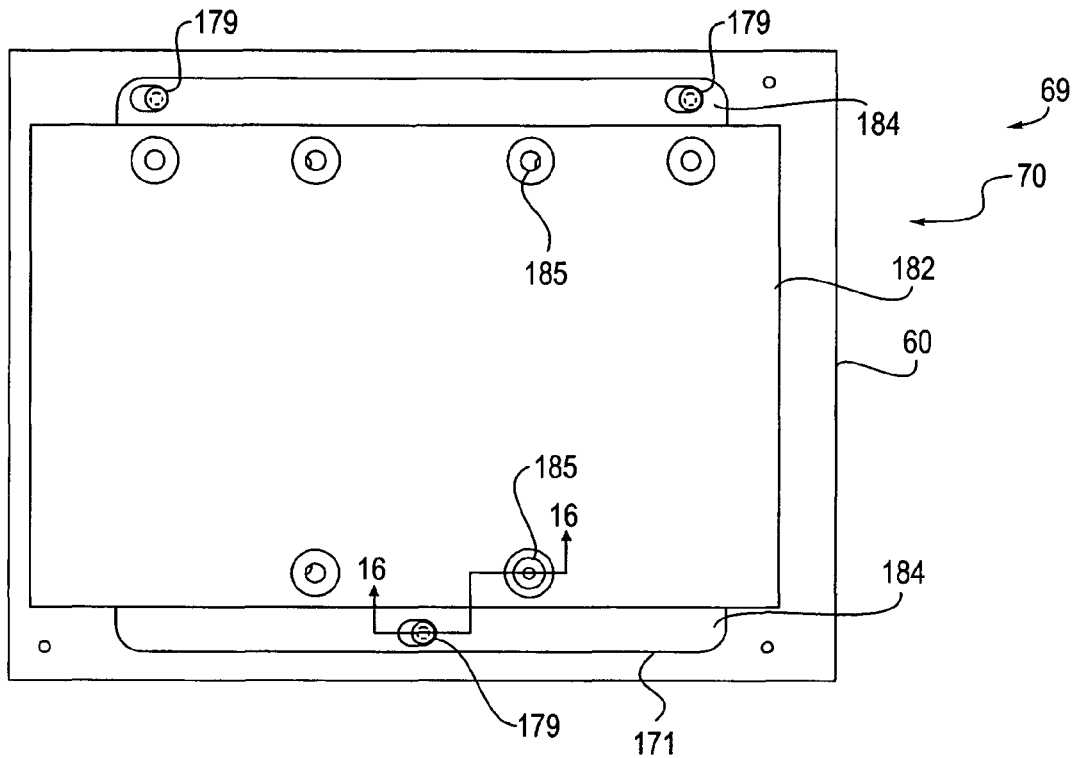
FIG. 15 is a top plan view, similar to FIG. 8, of the apparatus for planarizing a probe card of FIG. 2 in a fourth position.
Figure 16:
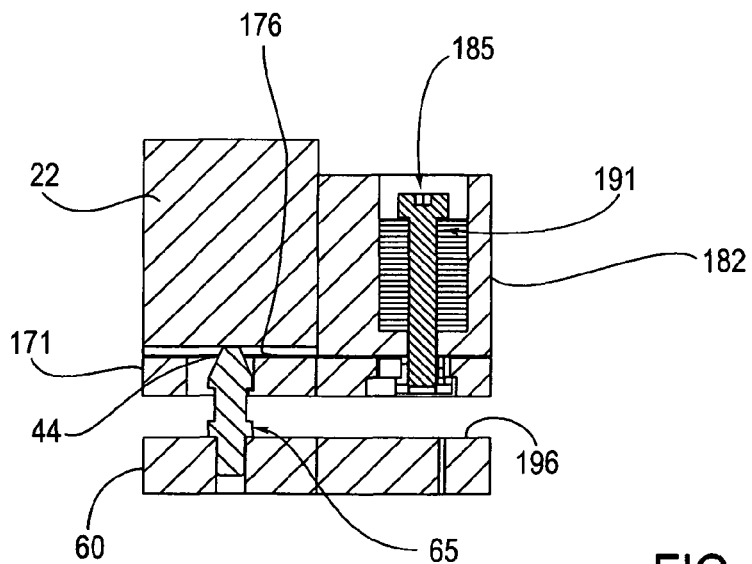
FIG. 16 is a cross-sectional view, similar to FIG. 9, of the apparatus for planarizing a probe card of FIG. 2 taken along the line 16-16 of FIG. 15.

In the method of operating and using apparatus 69, latching mechanism 70 engages and lifts the alignment elements 65 upwardly to urge the top surfaces 68 of the alignment elements 65 against the bottom planar surface 44 of the reference plate 42. A latching sequence utilizing apparatus 69 is described with reference to FIGS. 8-17. The operator initially loads probe card 34 into wafer prober 15 by means of access door 24. The probe card 34 is placed onto an internal mechanism of the wafer prober (not shown) which delivers the probe card to a position beneath latching mechanism 70, which position is similar to the position illustrated in FIG. 9 where only a portion of the probe card 34 is shown. Such internal mechanism aligns elements 65 with the large openings 178 of the keyholes slots 176, as illustrated in FIGS. 8 and 9, and then raises the alignment elements 65 to align grooves 177 of the elements 65 with the inner ledges 180 of the keyhole slots 176, as illustrated in FIGS. 11 and 12. The lift plate 171 is then slid laterally by the actuator 186 referred to above, thereby sliding the latch plate 171 coupled to the lift plate 182 laterally. This causes the inner ledges 80 of the keyhole slots 176 to engage the annular grooves 177 of the alignment elements 65 (see FIGS. 13 and 14). The lift plate 182 is then raised upwardly by the actuator, thereby lifting the latch plate 147 upwardly until all of the top surfaces 68 on the heads 179 of the alignment elements 65 engage the bottom planar surface 44 of the reference plate 42 (see FIGS. 15 and 16). The probe card 34 is electrically connected to the die by having the chuck 30 mechanically position the wafer 33 so that bonding pads of the die contact respective probe elements or probes 59 of the probe card 34.

The nonrigid attachment of the latch plate 171 to the lift plate 182, by means of couplers 185, permits the latch plate to separate from the lift plate as necessary to accommodate any misalignment between the plates 171 and 182, such as the top surface of the latch plate 171 not being parallel to the bottom surface 44 of the reference plate 42 when all of the top surfaces 68 of the alignment elements 65 have engaged the reference plate 42. More specifically, each of the couplers 185 can float within its respective cavity 192 to permit such movement between plates 171 and 182. Springs 191 serve to urge or push against the flanged top ends 189 of couplers 185 so as to continually urge top surfaces 168 of the alignment elements 65 against the planar surface 44 of the reference plate 42 regardless of any such movement of latch plate 171 relative to lift plate 182. The amount of each such spring force can be predetermined by adjustment of the amount that the spring 191 is initially compressed within the lift plate 182. Preferably, the alignment elements 65 are urged against the planar surface 44 with sufficient force to prevent translation and rotation of the alignment elements 65, and the probe card 34 attached thereto, relative to the reference plate 22 during the operation of system 14.

FIG. 17 shows the probe card 34 attached to the reference plate 22 and thus wafer prober 15 by means of apparatus 69 and latching mechanism 70 thereof. As shown therein, as well as in FIG. 16, a gap 196 exists between the bottom surface of latch plate 171 and the top surface of stiffener plate 60 when the probe card 34 has been referenced and affixed to the reference plate as described above. Gap 196 desirably accommodates any irregularities, misalignments or lack of planarity between the stiffener plate 60 and the reference plate 22 which may exist prior to the operation of system 14 or which may come about as a result of changes in temperature or mechanical forces experienced by the probe card 34, during the operation of the system 14.

As can be seen, apparatus 69 and the method of the present invention serve to planarize the top surfaces 68 of the alignment elements 65 with the bottom planar surface 44 of the reference plate 42 and hence the top surface 32 of the chuck 30. Because the plane of the probe array 58 is planar with the plane of the top surfaces 68 of the alignment elements 65 and the plane of such top surfaces 68 is planar with the plane of the chuck 30 when urged against the planar surface 44 of the reference plate 42, the plane of the probe array 58 is planar with the plane of the chuck 30 so as to facilitate proper engagement of the probe array 58 with die on the wafer 33 and thus accurate testing of such die. In the latched state, the latching mechanism 70 thus firmly holds the central portion 56 of the probe card 58 planar with the chuck 30.

The system of the invention offers advantages over the prior art. One advantage is that distortions of the probe card 34 outside the central portion 56 of the probe card 34 have minimal effect on planarization of the probe array 58 because the central portion 56 is held planar by the reference plate 42. FIG. 18 illustrates how distortions of the PCB 48 of the probe card 34 do not affect the planarization of the probe array 58. Apparatus 69 can thus reduce the need to provide a stiffener plate extending beyond the central portion 56 of the probe card 34 to maintain planarity of the probe array 58, thereby reducing the weight of the probe card 34.

Another advantage is that the reference plate 42 adds rigidity to the central portion 56 of the probe card 34 by holding the central portion 56 planar to the reference plate 42. In addition, the reference plate 42 does not increase the thermal mass of the probe card 34 because the reference plate 42 is thermally isolated from the probe card 34 by a gap 96, assuming negligible thermal conduction through the alignment elements 65. As a result, the reference plate 42 is subject to significantly less thermal distortion during temperature testing of the wafer. Low thermal mass is important because it reduces the time required for the temperature of the probe card 34 to stabilize during temperature testing of the wafer.

Apparatus 69, and the method of the present invention, serve to rigidly couple or secure the central portion 56 of the probe card 34 to the bridging support member 42 and thus to wafer prober 15. In the preferred embodiment, the peripheral portion 52 of the probe card 34 is free of the reference plate 42, that is not supported by the reference plate 42 or the wafer prober 15. Notwithstanding the foregoing, the invention is broad enough to cover methods and apparatus where some small portion or percentage of the peripheral portion 52 of the probe card 34 is contacted by the wafer prober, for example for purposes other than supporting the probe card 34. The invention is also broad enough to cover methods and apparatus where some small portion or percentage of the peripheral portion 52 of the prober card 34 is supported by the wafer prober, such as by the reference plate 42 or top probe deck 22, so long as the main or significant proportion or majority of the weight of the probe card 34 is supported by the central portion 56 of the card 34.

Supporting probe card 34 substantially or preferably solely by the central portion 56 advantageously serves to free the peripheral portion 52 of the probe card 34 for other purposes. For example, freeing the peripheral portion 52 of the probe card from support pins or other support elements can expand the methods and means by which test head 36 can engage the probe card 34.

Figure 19:
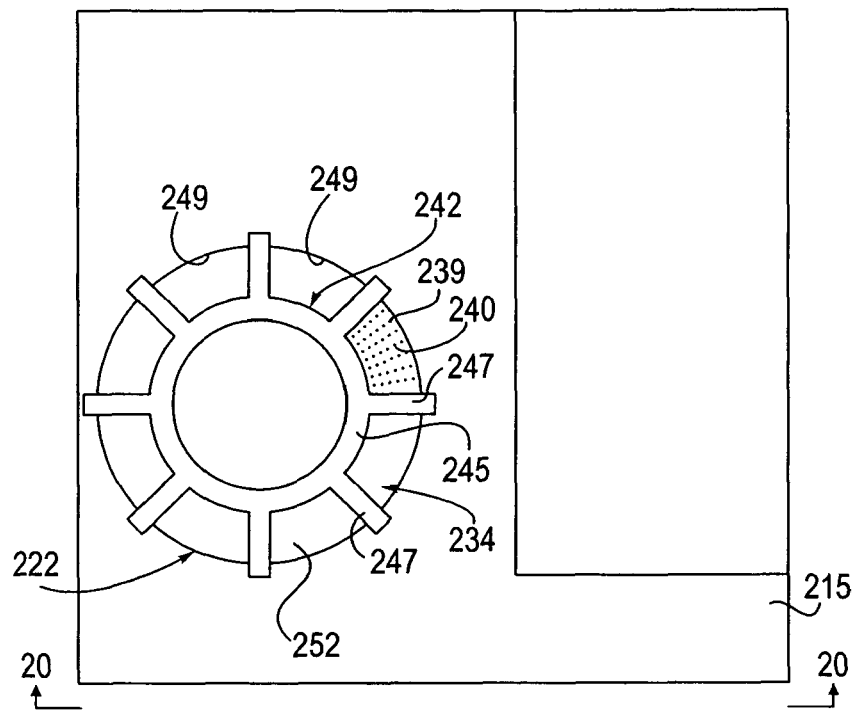
FIG. 19 is a schematic top plan view of a wafer prober utilizing another embodiment of the apparatus for planarizing a probe card of the present invention.
Figure 20:
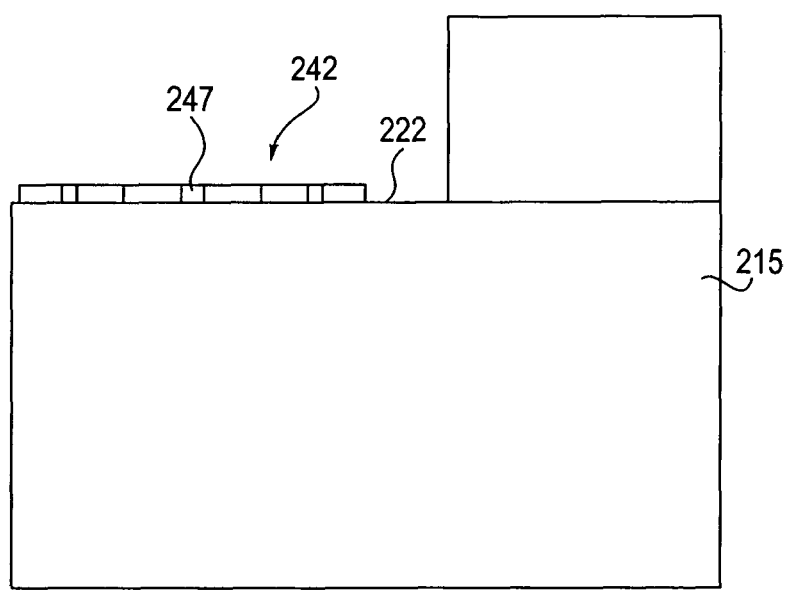
FIG. 20 is a schematic, cross-sectional view of the wafer prober of FIG. 19 taken along the line 20-20 of FIG. 19.

The invention can be used to planarize the probe arrays of various types of probe cards, including circular and other nonrectangular-shaped probe cards. In another embodiment of the apparatus for planarizing a probe card of the present invention, a reference plate 242 for use with a circular probe card 234 is provided. The reference plate 242, shown on a circular top deck 222 of a wafer prober 215 in FIGS. 19 and 20, has a central portion 245 with spokes 247 extending therefrom and attaching to or integral with the circular top deck 222. The spokes 247 rigidly support the reference plate 242 above the circular probe card 234, a peripheral portion 252 of which is shown in FIG. 19 underlying the reference plates 242. Contact pads 239 are provided on the upper surface of the substrate layer or printed circuit board 248 of the card 234. For simplicity, only a single array of the contact pads 239 are shown in FIG. 19. Spokes 247 are arranged to provide access openings 249 therebetween so that an appropriately configured test head 36 can access the underlying probe card 234, and specifically contact pads 239 thereon. The latching mechanism and reference planar surface (not shown), similar to latching mechanism 70 and reference planar surface 44 described above, are located in the central portion 245 of the reference plate 142.

Figure 21:
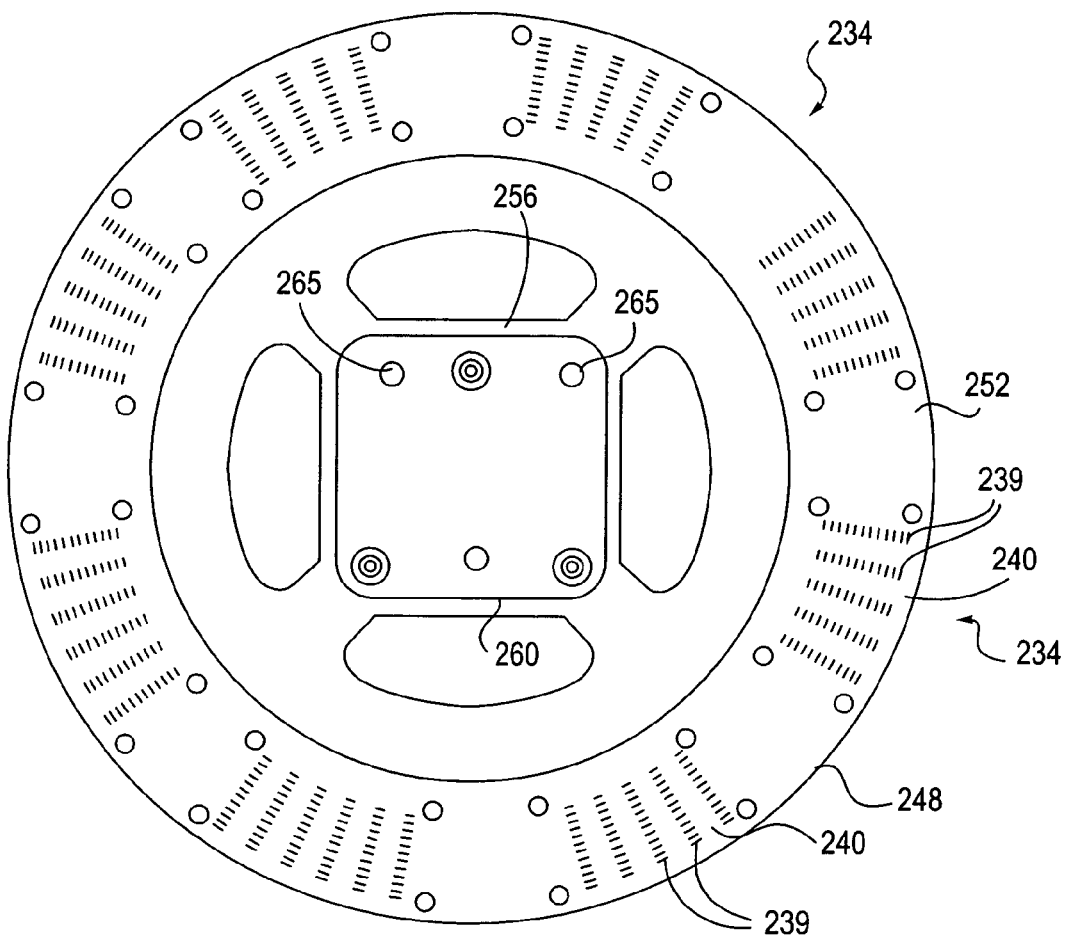
FIG. 21 is a schematic, top plan view of a circular probe card for use with the apparatus for planarizing a probe card of FIG. 19.

The circular probe card 234, shown in plan in FIG. 21, includes a stiffener plate 260 within a central portion 256 of the probe card 234 and exemplary arrays 240 of contact pads 239 arranged in a ring along a periphery 252 of the probe card 234. A probe array, not shown but similar to probe array 58 described above, descends from a bottom of the probe card 234 within the central portion 256. Three or more alignment elements 265, which can be substantially similar to alignment elements 65 described above, are attached to the stiffener plate 270 within central portion 156 and extend upwardly from the probe card 234. The alignment elements 256 cooperate with reference plate 234 in the manner described above to planarize or make parallel the probe array with respect to the top surface of the chuck (not shown) of the wafer prober 215. More specifically, the top surfaces of the alignment elements 265 are urged against the bottom planar surface of the reference plate 242.

It should be appreciated from the foregoing that the reference member or plate of the present invention can be configured and shaped to accommodate any sized and shaped probe card. As discussed above, for example, the reference plate can be rectangular or circular in plan. Openings or apertures can be provided in the reference plate, in any suitable configuration, for permitting access to the contact pads of a probe card positioned beneath the reference plate. For example, round reference plate 242 is provided with spokes which define openings therebetween for accessing arrays of contact pads 239 provided on a circular probe card 234.

It is appreciated that the feature of the reference member defining a plane referenced above is not limited to a planar surface but can be of any suitable configuration. For example, such feature can be a plurality of spaced-apart, outwardly-extending alignment elements like elements 65 above. Similarly, the feature of the probe card defining a plane is not limited to the spaced-apart outwardly-extending alignment elements 65 discussed above, but can be of any suitable configuration. Thus, for example, outwardly-extending alignment elements, such as alignment elements 65 above, can be provided on reference member or plate 42 or elsewhere on the wafer prober, instead of on stiffening plate 60 as discussed above. Where, for example, the alignment elements depend from the reference plate 42 and have end surfaces defining a plane that is parallel to the upper surface 32 of the chuck 30, a planar reference surface is provided on the probe card, for example as the upper surface of stiffening plate 60, which is parallel to the plane of the probe array 58. A latching assembly or mechanism, for example similar to latching mechanism 70, can be mounted on the top of the central portion of the probe card for gripping the alignment elements of the reference member in the manner described above with respect to mechanism 70. Alternatively, when the alignment elements are provided on the reference member or elsewhere on the wafer prober the latching assembly or mechanism can be rigidly coupled to the wafer prober, such as to reference member 42 as described above, for gripping a set of coupling elements extending upwardly from the stiffening plate 60 or elsewhere on the central portion of the probe card. Such an embodiment could thus have alignment elements depending from the reference member and coupling elements, for example similar to alignment elements 65, upstanding from the stiffening plate 60. It is further appreciated that any reference plane of the invention can be formed from a single surface or a set of distinct surfaces that extend in a single plane.

Although a latching mechanism was employed in the preferred embodiment, other means may be employed to urge the top surfaces of the alignment elements of the apparatus of the present invention against the bottom planar surface of the reference plate. For example, the entire probe card may be raised toward the reference plate so that the top surfaces of the alignment element abut against the bottom planar surface of the reference plate. This may be done, for example, by securing the probe card to a movable plate capable of raising and lowering the probe card. The probe card may be grasped, clamped or otherwise moved at its peripheral portion or any other portion.

As can be seen from the foregoing, an apparatus for planarizing a probe card has been provided which minimizes distortion of the probe card, particularly in the vicinity of the probe array mounted to the underside of the probe card. The apparatus can include a plurality, preferably a plurality of at least three, alignment elements disposed in the central portion of the probe card for aligning the planarity of the probe array provided on the underside of the probe card with a reference plate of a wafer prober. The alignment elements can be urged against a reference plane of the reference plate by being grasped by a latching mechanism or by engaging any other portion of the probe card so as to urge the alignments elements secured thereto against the reference plate.

We claim:

1. A method for using a probe card having a central portion provided with a stiffening member for adding rigidity to the central portion and a plurality of alignment elements and having a peripheral portion with a wafer prober having a reference member and a test head comprising urging the alignment elements against the reference member, securing the central portion of the probe card to the wafer prober, the peripheral portion of the probe card extending free of the wafer prober, and engaging the probe card with the test head.

2. The method of claim 1 wherein the central portion has a depending probe assembly and a feature defining a plane and wherein the wafer prober is provided with a top deck having the reference member, further comprising urging the feature in the central portion of the probe card defining a plane against the reference member to align the probe assembly relative to the wafer prober.

3. The method of claim 2 wherein the plurality of alignment elements provide the feature defining a plane and include at least three spaced-apart, upwardly-extending alignment elements having respective end surfaces substantially defining the plane.

4. The method of claim 3 wherein the reference member has a bottom surface extending substantially in a plane and wherein the urging step includes urging the feature of the probe card defining a plane against the bottom surface of the reference member.

5. The method of claim 2 wherein the feature of the probe card defining a plane is a planar surface.

6. The method of claim 1 wherein the wafer prober has a top probe deck provided with the reference member and wherein the securing step includes securing the central portion of the probe card to the reference member.

7. The method of claim 1 wherein the test head has test pins and wherein the probe card has contact elements on the peripheral portion, and wherein the engaging step includes electrically coupling the test pins of the test head with the contact elements of the probe card.

8. The method of claim 1 wherein the engaging step includes engaging the peripheral portion of the probe card with the test head.

9. A method for using a probe card having a central portion provided with a stiffening member for adding rigidity to the central portion and a plurality of alignment elements and having a peripheral portion provided with contact elements with a test head having electrical elements and with a wafer prober having a reference member, comprising urging the alignments elements against the reference member, securing the central portion of the probe card to the wafer prober so that the peripheral portion of the probe card extends free of the wafer prober and engaging the contact elements of the probe card with the electrical elements of the test head.

10. The method of claim 9 wherein the central portion has a depending probe assembly and a feature defining a plane and wherein the wafer prober is provided with a top deck having the reference member, further comprising urging the feature in the central portion of the probe card defining a plane against the reference member to align the probe assembly relative to the wafer prober.

11. The method of claim 9 wherein the wafer prober has a top probe deck provided with the reference member and wherein the securing step includes securing the central portion of the probe card to the reference member.

12. A method for using a probe card having a central portion provided with a stiffening member for adding rigidity to the central portion and a plurality of alignment elements and having a peripheral portion and opposite first and second surfaces with a wafer prober having a reference member and a test head comprising urging the alignment elements against the reference member, securing the central portion of the probe card to the wafer prober so that the peripheral portion of the probe card extends free of the wafer prober and engaging the first surface of the peripheral portion of the probe card with the test head.

13. The method of claim 12 wherein the wafer prober has a top probe deck provided with the reference member and wherein the securing step includes securing the central portion of the probe card to the reference member.

14. The method of claim 12 wherein the test head has test pins and wherein the probe card has contact elements on the peripheral portion, and wherein the engaging step includes electrically coupling the test pins of the test head with the contact elements of the probe card.

* * * * *